(12) United States Patent
Tong et al.

(10) Patent No.: US 7,462,552 B2
(45) Date of Patent: Dec. 9, 2008

(54) METHOD OF DETACHABLE DIRECT BONDING AT LOW TEMPERATURES

(75) Inventors: Qin-Yi Tong, Durham, NC (US); Gaius Gillman Fountain, Jr., Youngsville, NC (US)

(73) Assignee: Ziptronix, Inc., Morrisville, NC (US)

( * ) Notice: Subject to any disclaimer, the term of this patent is extended or adjusted under 35 U.S.C. 154(b) by 302 days.

(21) Appl. No.: 11/134,359

(22) Filed: May 23, 2005

(65) Prior Publication Data

US 2006/0264004 A1 Nov. 23, 2006

(51) Int. Cl.
*H01L 21/46* (2006.01)
(52) U.S. Cl. .............................. 438/458; 257/E21.567; 438/455; 438/459
(58) Field of Classification Search .......... 257/E21.567; 438/455, 458, 459
See application file for complete search history.

(56) References Cited

U.S. PATENT DOCUMENTS

| | | | |
|---|---|---|---|
| 5,563,084 A | 10/1996 | Ramm et al. |
| 5,945,012 A | 8/1999 | Chan |
| 5,985,742 A | 11/1999 | Henley et al. |
| 5,994,207 A | 11/1999 | Henley et al. |
| 6,010,579 A | 1/2000 | Henley et al. |
| 6,013,563 A | 1/2000 | Henley et al. |
| 6,013,567 A | 1/2000 | Henley et al. |
| 6,033,974 A | 3/2000 | Henley et al. |
| 6,048,411 A | 4/2000 | Henley et al. |
| 6,051,073 A | 4/2000 | Chu et al. |
| 6,083,324 A | 7/2000 | Henley et al. |
| 6,103,599 A | 8/2000 | Henley et al. |
| 6,146,979 A | 11/2000 | Henley et al. |
| 6,153,524 A | 11/2000 | Henley et al. |
| 6,155,909 A | 12/2000 | Henley et al. |
| 6,159,824 A | 12/2000 | Henley et al. |
| 6,159,825 A | 12/2000 | Henley et al. |
| 6,162,705 A | 12/2000 | Henley et al. |
| 6,171,965 B1 | 1/2001 | Kang et al. |
| 6,180,496 B1 | 1/2001 | Farrens et al. |
| 6,184,111 B1 | 2/2001 | Henley et al. |
| 6,186,091 B1 | 2/2001 | Chu et al. |
| 6,187,110 B1 | 2/2001 | Henley et al. |
| 6,204,151 B1 | 3/2001 | Malik et al. |
| 6,207,005 B1 | 3/2001 | Henley et al. |
| 6,213,050 B1 | 4/2001 | Liu et al. |
| 6,221,740 B1 | 4/2001 | Bryan et al. |

(Continued)

OTHER PUBLICATIONS

J.W. Matthews et al., "Defects in Epitaxial Multilayers", Journal of Crystal Growth, 17, pp. 118-125 (1974).

(Continued)

*Primary Examiner*—Asok K Sarkar
(74) *Attorney, Agent, or Firm*—Oblon, Spivak, McClelland, Maier & Neustadt, P.C.

(57) ABSTRACT

A method for detachable bonding that forms an amorphous silicon layer, or a silicon oxide layer with a high hydrogen content, on an element such as a carrier substrate. A second element, such as a substrate, is bonded to the amorphous silicon layer or silicon oxide layer, and the second element may then have a portion removed. A third element, such as a host or carrier substrate, is bonded to the second element or to the remaining portion of the second element to form a bonded structure. The bonded structure is then heated to cause the first element to detach from the bonded structure.

78 Claims, 5 Drawing Sheets

U.S. PATENT DOCUMENTS

| | | | |
|---|---|---|---|
| 6,221,774 | B1 | 4/2001 | Malik |
| 6,245,161 | B1 | 6/2001 | Henley et al. |
| 6,248,649 | B1 | 6/2001 | Henley et al. |
| 6,265,328 | B1 | 7/2001 | Henley et al. |
| 6,269,765 | B1 | 8/2001 | Chu et al. |
| 6,274,459 | B1 | 8/2001 | Chan |
| 6,284,631 | B1 | 9/2001 | Henley et al. |
| 6,287,941 | B1 | 9/2001 | Kang et al. |
| 6,290,804 | B1 | 9/2001 | Henley et al. |
| 6,291,313 | B1 | 9/2001 | Henley et al. |
| 6,291,314 | B1 | 9/2001 | Henley et al. |
| 6,291,326 | B1 | 9/2001 | Henley et al. |
| 6,294,814 | B1 | 9/2001 | Henley et al. |
| 6,300,227 | B1 | 10/2001 | Lu et al. |
| 6,321,134 | B1 | 11/2001 | Henley et al. |
| 6,335,264 | B1 | 1/2002 | Henley et al. |
| 6,391,740 | B1 | 5/2002 | Cheung et al. |
| 6,448,152 | B1 | 9/2002 | Henley et al. |
| 6,455,399 | B2 | 9/2002 | Malik et al. |
| 6,458,672 | B1 | 10/2002 | Henley et al. |
| 6,486,041 | B2 | 11/2002 | Henley et al. |
| 6,489,241 | B1 | 12/2002 | Thilderkvist et al. |
| 6,500,268 | B1 | 12/2002 | Henley |
| 6,500,732 | B1 | 12/2002 | Henley et al. |
| 6,511,899 | B1 | 1/2003 | Henley et al. |
| 6,514,838 | B2 | 2/2003 | Chan |
| 6,528,391 | B1 | 3/2003 | Henley et al. |
| 6,534,381 | B2 | 3/2003 | Cheung et al. |
| 6,544,862 | B1 | 4/2003 | Bryan |
| 6,548,382 | B1 | 4/2003 | Henley et al. |
| 6,558,802 | B1 | 5/2003 | Henley et al. |
| 6,562,720 | B2 | 5/2003 | Thilderkvist et al. |
| 6,582,999 | B2 | 6/2003 | Henley et al. |
| 6,632,324 | B2 | 10/2003 | Chan |
| 6,632,724 | B2 | 10/2003 | Henley et al. |
| 2005/0151155 | A1* | 7/2005 | Auberton-Herve ......... 257/103 |

OTHER PUBLICATIONS

Y. Hayashi et al., "Fabrication of Three-Dimensional IC Using "CUmulatively Bonded IC" (Cubic) Technology", 1990 Symposium on VLSI Technology, Digest of Technical Papers, pp. 95-96 (Jun. 1990).

Qin-Yi Tong et al., "Reversible Silicon Wafer Bonding for Surface Protection: Water-Enhanced Debonding", J. Electrochem. Soc., vol. 139, No. 11, pp. L101-L102 (Nov. 1992).

G. Cha et al., "Why Debonding is Useful in SOI?", Proc. Wafer Bonding Symp., vol. 99-35, pp. 119-128 (1999).

M. Alexe et al., "Wafer Contamination Protection by Direct Wafer Bonding and Air Jet Debonding", Electrochem. Soc. Proceedings vol. 99-35, pp. 195-199 (1999).

E. Yablonovitch et al., "Van Der Waals bonding of GaAs epitaxial liftoff films onto arbitrary substrates", Appl. Phys. Lett. 56, pp. 2419-2421 (Jun. 1990).

H. Wada et al., "Wafer Bonding Technology For Optoelectronic Integrated Devices", Solid-State Electronics 43, pp. 1655-1663 (1999).

K. Koh et al., "Bonding Technology of Semiconductor Film on Piezoelectric Substrate Using Epitaxial Lift-Off Technology", Jpn. J. Appl. Phys. vol. 40, pp. 3734-3739 (2001).

K.W. Guarini et al., "Electrical Integrity of State-of-the-Art 0.13 μm SOI CMOS Devices and Circuits Transferred for Three-Dimensional (3D) Integrated Circuit (IC) Fabrication", Digest Intl. Electron. Device Meeting, pp. 943-945 (2002).

T. Sameshima, "Laser Beam Application to Thin Film Transistors", Appl. Surface Sci., 96-98; pp. 352-358 (1996).

D. Toet et al., "Laser-Assisted Transfer of Silicon By Explosive Hydrogen Release", Appl. Phys. Lett., vol. 74, No. 15, pp. 2170-2172 (Apr. 1999).

W.G. En et al., "The Genesis Process: A New SOI Wafer Fabrication Method", Proceedings IEEE Intl. SOI Conf., pp. 163-164 (Oct. 1998).

P. Gupta et al., "Hydrogen Desorption Kinetics from Monohydride and Dihydride Species on Silicon Surfaces", The American Physical Society, vol. 37, No. 14, pp. 8234-8244 (May 1988).

C.G. Van de Walle et al., "Microscopic Theory of Hydrogen in Silicon Devices", IEEE Transaction on Electron Devices, vol. 47, No. 10 (Oct. 2000).

T. Shimoda et al., "Surface Free Technology by Laser Annealing (SUFTLA)", IEDM 99, pp. 289-292 (1999).

M. Sickmiller, "Packaging of Ultrathin Semiconductor Devices Through the ELO Packaging Process", Mat. Res. Soc. Symp. Proc. vol. 681E (2001).

Qin-Yi Tong, "Integration of Materials and Device Research Enabled by Wafer Bonding and Layer Transfer", Mat. Res. Soc. Symp. Proc., vol. 681E (2001).

R. Dekker et al., "An Ultra Low-Power RF Bipolar Technology on Glass", Digest of International Electron Device Meeting, 921 (1997).

M. Bruel, "Silicon on Insulator Material Technology", Electronics Letters vol. 31 No. 14, pp. 1201-1202 (Jul. 1995).

P.J.H. Denteneer et al., "Microscopic Structure of the Hydrogen-boron Complex in Crystalline Silicon", Physical Review B. 39, 10809 (1989).

G. Hess et al., "Evolution of Subsurface Hydrogen from Boron-Doped Si(100)", Appl. Phys. Lett. 71, 2184 (1987).

K. Mitani et al., "Causes and Prevention of Temperature-Dependent Bubbles in Silicon Wafer Bonding", J. Journal of Applied Physics, vol. 30, No. 4, Apr. 1991, pp. 615-622.

M. Bruel et al., "Smart Cut: A Promising New SOI Material Technology", IEEE International SOI Conference, Oct. 1995, pp. 178-179.

K. Bergman et al., "Donor-hydrogen complexes in passivated silicon", The American Physical Society, Physical Review B, vol. 37, No. 5, pp. 2770-2773, Feb. 1988.

A.H. Mahan et al., "Characterization of Microvoids in Device-Quality Hydrogenated Amorphous Silicon by Small-Angle X-Ray Scattering and Infrared Measurements", The American Physical Society, Physical Review B, vol. 40, No. 17, pp. 12024-12027, Dec. 1989.

M. Niwano et al., "Morphology of Hydrofluoric Acid and Ammonium Fluoride-treated Silicon Surfaces Studied by Surface Infrared Spectroscopy", J. Appl. Phys. vol. 71, No. 11, pp. 5646-5649, Jun. 1992.

L. Lusson et al., "Hydrogen Configurations and Stability in Amorphous Sputtered Silicon", J. Appl. Phys. vol. 81, No. 7, pp. 3073-3080, Apr. 1997.

J. Borenstein et al., "Kinetic Model For Hydrogen Reactions in Boron-Doped Silicon", J. Appl. Phys. vol. 73, No. 6, pp. 2751-2754, Mar. 1993.

P. Gupta et al., "Hydrogen Desorption Kinetics from Monohydride and Dihydride Species on Silicon Surfaces", The American Physical Society, Physical Review B, vol. 37, No. 14, pp. 8234-8243, 1988.

S.J. Pearton et al., "Hydrogen in Crystalline Semiconductors", Appl. Phys. A vol. 43, pp. 153-195, 1987.

B. Aspar et al., "Basic Mechanisms involved in the Smart-Cut Process", Microelectronic Engineering 36, pp. 233-240, 1997.

S.J. Pearton et al., "Hydrogen and the Mechanical Properties of Semiconductors", Hydrogen in Crystalline Semiconductors, Chapter 12, pp. 319-330, Springer-Verlag, 1992.

L.B. Freund, "A lower bound on implant density to induce wafer splitting in forming compliant substrate structures", Am. Inst. of Physics, Appl. Phys. Lett. 70 (26), pp. 3519-3521, Jun. 1997.

M.K. Weldon et al., "On the mechanism of the hydrogen-induced exfoliation of silicon", J. Vac. Sci. Technol. B 15(4), pp. 1065-1073, Jul./Aug. 1997.

A.J. Auberton-Herve et al., "SIMOX Technology and Applications to Wafer Bonding", Electrochemical Society Proceedings, vol. 95-7, pp. 12-18, 1995.

L. Di Cicoccio et al., "Silicon carbide on insulator formation by the Smart-Cut process", Materials Science Engineering B46, pp. 349-356, 1997.

E. Jalaguier et al., "Transfer of 3 in GaAs film on silicon substrate by proton implantation process", Electronics Letters, vol. 34, No. 4, pp. 408-409, Feb. 1998.

Qin-Yi Tong et al., "Layer Transfer by Bonding and Layer Splitting", Semiconductor Wafer Bonding: Science and Technology, Section 6.3.2, pp. 161-169, Published by John Wiley & Sons, 1999.

* cited by examiner

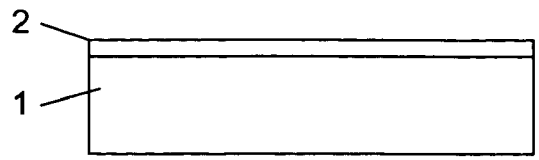
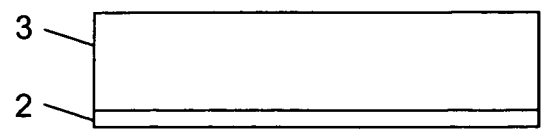
FIG. 1A　　　　　　　　FIG. 1B
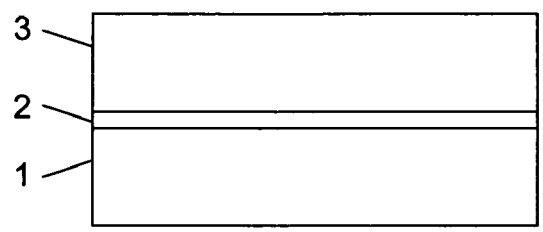
FIG. 2A
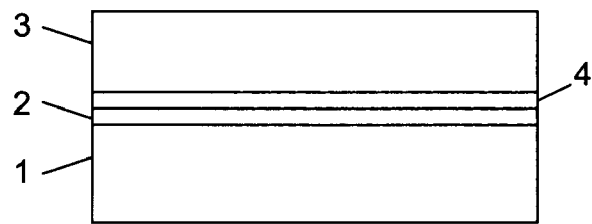
FIG. 2B
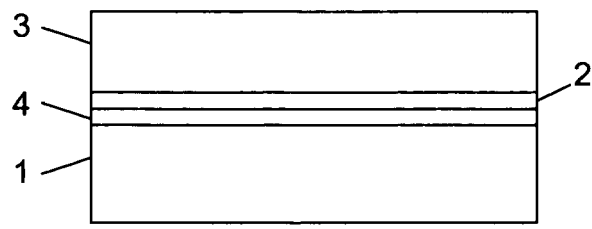
FIG. 2C

METHOD OF DETACHABLE DIRECT BONDING AT LOW TEMPERATURES

CROSS REFERENCE TO RELATED APPLICATIONS

This application is related to U.S. application Ser. No. 10/505,283 filed on Feb. 16, 2000, entitled "Method for Low Temperature Bonding and Bonded Structure," the entire contents of which are incorporated herein by reference.

DISCUSSION OF THE BACKGROUND

1. Field of the Invention

This invention relates to a method of detachable direct bonding at low temperatures used for thin wafer or die layer transfer and the application of such techniques in materials, devices, and 3-D (three-dimensional) device integration.

2. Background of the Invention

As the scaling limits of the conventional bulk silicon device are approaching, there is a strong demand to monolithically combine a variety of materials to form integrated materials for integrated circuits (ICs) with enhanced performances. For system-on-a chip (SOC) preparation, a variety of functions are required on a chip. Many functions are usually best made from their respective materials other than silicon. Therefore, integrated materials that combine thin films of dissimilar materials on a single wafer are highly desirable. Wafer or die direct bonding is one technology to achieve this goal. Usually, wafers or dies with thickness that are sufficient for handling are bonded at room temperature followed by annealing at elevated temperatures to enhance the bond. In order to bond dissimilar materials having different thermal expansion coefficients, low temperature bonding is utilized. Low temperature bonding is also crucial for materials having a low decomposition temperature or for materials that are temperature sensitive even though such materials can be thermally matched.

Moreover, wafers or dies of dissimilar materials that are bonded to the host substrate are preferably thinned to a thickness that is less than a critical value for the respective materials combination to avoid generation of misfit dislocations in the layer and to prevent sliding or cracking of the bonded pair during subsequent thermal processing steps. Transfer of dissimilar layers of different types onto a host wafer can be accomplished for example by the following steps: (1) bond a full thickness wafer or dies to a carrier substrate, (2) thin the bonded wafer or dies by grinding, CMP (chemo-mechanical polishing), etching or splitting, (3) subsequently bond the thinned wafer or dies which are bonded to the carrier substrate to a host wafer, and then (4) remove the carrier substrate.

Design of processes needed to produce different functions on the same chip of integrated materials can be difficult and hard to optimize. Also, resultant SOC chips may get too large, leading to a low yield. Therefore, one alternative approach is to interconnect different IC layers that are fully processed and tested to form stacking ICs or three-dimensional system-on-a chip (3-D SOC) by wafer bonding and layer transfer. Ramm et al in U.S. Pat. No. 5,563,684, the entire contents of which are incorporated by reference, describe such integration. Since wafer direct bonding and layer transfer is Very Large Scale Integration (VLSI) compatible, flexible and manufacturable technology, using direct bonding to form 3-D SOC is highly favorable to other bonding methods such as adhesive bonding or anodic bonding. The 3-D SOC approach is also complementary to the materials integration method because the processed functional layers can be considered as unique dissimilar materials layers. In many cases it is desirable that the thin device dies that are transferred onto a host wafer are top-up. This can be realized by the layer transfer procedures mentioned above.

Transfer of a device layer from its host substrate to a desired substrate can significantly improve device performance. Workers in the field have shown that, by device layer transfer from its host silicon wafer to a glass substrate, an ultra low power RF bipolar IC was realized. Furthermore, the transfer of a power device layer from a host silicon wafer to a highly thermally conductive substrate is expected significantly increase device power capability. In general, device layer transfer provides opportunities for device performance enhancement.

Traditionally, mechanical grinding, polishing or selective etching are employed to remove the handle substrate in the final step of the layer transfer procedures mentioned above. However, these methods are time consuming, environmentally unfriendly and result in a low thickness uniformity of the remaining layer. A detachable bonding technology that can separate the carrier wafer itself at step (4) is desired. A few methods of detachable bonding methods have been suggested; such as for example water-enhanced de-bonding, gas or water jet de-bonding, using a water-soluble or solvent-soluble adhesive bonding layer, wax bonding, plasma removal of a polyimide bonding layer, and laser ablation of polymeric adhesive bonding layer or a hydrogenated amorphous silicon (a-Si:H) bonding layer. These methods have drawbacks.

In water-enhanced de-bonding, the bonding energy of the bonded wafers has to be very low ($\sim 100$ mJ/m$^2$) and therefore, is not sufficient for the layer transfer process steps. The low bonding energy makes water-enhanced de-bonding useful only for wafer surface protection by wafer bonding. In gas or water-jet debonding, in order to avoid damaging the separated wafer surfaces, the bonding energy of the bonded pairs is limited to below 750 mJ/m$^2$ and practically can only work at a wafer level. Meanwhile, water or solvent debonding is based on water- or solvent-soluble adhesive bonding technologies that are suspect if a strong, reliable and uniform bonds are needed. Water or solvent-de-bonding also relies on the lateral reaction between the water or solvent and the adhesive bonding layer at the bonding interface is time consuming and limits the size of the bonded pairs.

For wax bonding, Apiezon® wax is employed as either the substrate itself or a bonding layer. For the latter, wax bonding has similar problems as in water-soluble bonding. For the former, Apiezon wax is not strong enough for processes in a layer transfer procedure. Plasma removal of a polyimide bonding layer is similar to the water soluble process except the plasma removal is a dry process. In laser ablation, the carrier wafer must be transparent to the incident laser such as a glass wafer. This method requires ablation of the polymer layer or the a-Si:H layer at the film/substrate interface, and is based on the explosive release and accumulation of gas from the film/substrate interface. Exciter laser pulses with energy >400 mJ/cm$^2$ are required.

Hence, prior art techniques for bonding and release present numerous drawbacks and disadvantages.

SUMMARY OF THE INVENTION

The present invention is directed to a bonding method having steps of forming a structure consisting of a first element, an amorphous silicon layer disposed on the first element, and a second element disposed on the layer, bonding the second element to a third element to form a bonded structure, and heating the bonded structure at a temperature to detach the first element from the bonded structure.

The first element may detach from the bonded structure at an interface between the amorphous layer and the first or second element.

The amorphous layer may be comprised of silicon, silicon oxide, or silicon nitride.

The second element may be processed after bonding. For example, the second element may be thinned.

The method may also include a step of removing a substantial portion of the second element after bonding the second element to the amorphous layer. The removing step may include at least one of grinding and polishing. The second element may be a device substrate with a device layer, and a substantial portion of the device substrate may be removed to leave the device layer.

The amorphous layer may have impurities added, such as H, deuterium, He, Ne, Kr and Xe. The bonded structure may be heated at a temperature where the impurities in the amorphous layer are released. The amorphous layer may be formed below a temperature at which the impurities in the amorphous layer are released.

The amorphous layer may be a hydrogenated amorphous silicon layer. The hydrogenated amorphous silicon layer may have about 5-20 at. percent hydrogen concentration. The hydrogenated amorphous silicon layer is preferably formed below a temperature at which hydrogen releases from the amorphous silicon layer.

The amorphous layer may be a hydrogenated amorphous silicon oxide layer. The hydrogenated amorphous silicon oxide layer may have about 5-20 at. percent hydrogen concentration. The hydrogenated amorphous silicon layer is preferably formed below a temperature at which hydrogen releases from the amorphous silicon layer.

The method may also include a step of using released hydrogen to detach the first element from the bonded structure. Hydrogen can be accumulated at an interface between the first or second element and the hydrogenated amorphous layer, form hydrogen bubbles, and detach the first element from the bonded structure.

Nucleation sites may be formed on the second element, or on the first element prior to forming the amorphous layer. Forming the nucleation sites may be accomplished by one of roughening the surface of the first or second element, forming a hydrocarbon layer on the surface, or exposing the surface to a plasma. The surface may be exposed one of an N and Ar plasma in reactive ion etch mode. The splitting plane will be the surface on which the nucleation sites are formed.

All the elements can be bare substrates or substrates covered with a bonding layer such as an oxide layer.

Boron may be added to an amorphous silicon layer to a concentration of about $1 \times 10^{16}$ cm$^{-3}$ to $1 \times 10^{21}$ cm$^{-3}$. Also, one of In, Ga and Al may be added to a hydrogenated amorphous silicon layer.

The present invention is also directed to a bonding method including the steps of forming a structure consisting of a first element, a silicon oxide layer having about 5-20 at % hydrogen disposed on the first element, and a second element disposed on the layer, bonding the second element to a third element to form a bonded structure, and heating the bonded structure at a temperature to detach the first element from the bonded structure.

The present invention is further directed to a bonded structure having a first element and a substrate portion having a first surface bonded to the first element, directly or through an intervening bonding layer, and a second surface, opposing the first surface, detached from one of a silicon oxide layer and an amorphous silicon layer each containing about 5-20 at % hydrogen.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein:

FIGS. 1A and 1B are schematic illustrations of first and second substrates having an amorphous silicon layer;

FIGS. 2A, 2B and 2C illustrate bonding the first and second substrates with no bonding layer (2A) and with a bonding layer (2B, 2C), respectively;

DETAILED DESCRIPTION OF THE PREFERRED EMBODIMENTS

Figure 3A:
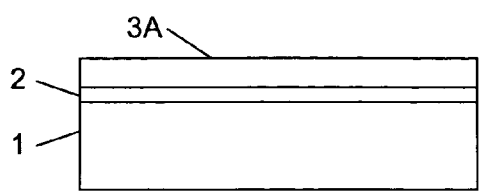
FIGS. 3A, 3B and 3C illustrate thinning of the backside of the second substrate.

Referring now to the drawings, wherein like reference numerals designate identical or corresponding parts throughout the several views, the embodiments of the invention will be described. The present invention, in a preferred embodiment, minimally involves three types of substrates, wafers or dies: a carrier or handle substrate, wafer or die; a second substrate, wafer or die to be bonded to the carrier or handle substrate, wafer or die and from which a thin layer is to be transferred; and a third host substrate, wafer or die to which the thin layer is transferred.

FIGS. 1A and 1B illustrate a first embodiment of the invention. Here, an amorphous silicon layer 2 is formed on a element 1, which may be made of any solid material, such as silicon, quartz, glass, ceramic, et al., that can provide support for layer 2 (or donor workpiece 3 and layer 2) and handling capability for subsequent processing steps described below, and preferably a carrier or host wafer or substrate, or on donor workpiece 3, which is any material from which a thin layer is to be transferred, as described below, and is preferably a substrate. The amorphous silicon layer 2 is of a thickness suitable for any needed polishing and/or etching to planarize and smooth the surface (as described below) typically in the range of 0.5 to 10 microns. Substrate 3 may also be a device wafer with a device layer to be transferred. For ease of explanation, element 1 and donor workpiece 3 are referred to hereafter as substrates 1 and 3. The amorphous silicon layer is preferably a hydrogenated amorphous silicon layer (a-Si:H). The a-Si:H layer is preferably deposited on substrate 1 or 3 by a chemical vapor deposition (CVD) process, but may also be formed by sputtering deposition. For a-Si:H deposition, as discussed below, the wafer temperature during deposition should be kept below the critical temperature at which hydrogen releases from the a-Si:H layer. Selection of this temperature (below the critical temperature) may take into consideration other factors such as the advantages of lower temperature deposition, the desired composition or structure of the layer, and the quality of the structure of the layers.

Substrate 3 from which a thin layer is to be transferred is directly bonded to substrate 1 via layer 2, at temperatures below the critical temperature at which hydrogen releases from the a-Si:H layer to obtain a bond strength sufficient to allow for subsequent processing such as, for example, CMP (Chemical Mechanical Polish), grinding, etching, dicing and splitting. Substrate 3 may be any material from which a thin layer is desired to be transferred to another wafer. Also, substrate 3 may be a device wafer having a device layer to be transferred. The surface of either substrate 1 or 3 that does not have layer 2 may be covered with a layer to promote bonding, preferably an oxide and more preferably a deposited silicon oxide, such as a PECVD (Plasma Enhanced CVD) silicon oxide, and also is preferably planarized and/or smoothed, in the manner as described above. This is illustrated in FIG. 2B, where layer 4 is disposed on substrate 3 and layer 4 is planarized and/or smoothed, as needed, and bonded to layer 2.

Alternatively, layer 2 may be formed on substrate 3 and layer 4 may be formed on substrate 1 (see FIG. 2C). If either substrate 1 or substrate 3 are not sufficiently planar, layers 2 and 4 are preferably sufficiently thick to allow a sufficient planarization with CMP.

Figure 3B:
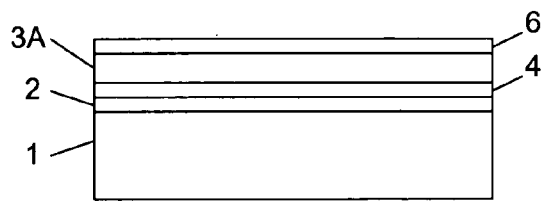
Figure 3C:
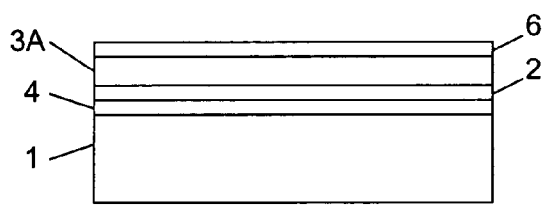

After bonding, as shown in FIG. 3A, substrate 3 is thinned to a desired thickness by, for example, CMP, polishing, grinding, etching, splitting (such as B+H co-implantation induced splitting) and/or peeling, or a combination of these techniques, to leave portion 3A. The resulting surface of portion 3A is planarized and/or smoothed, as needed. The thickness of the remaining portion will vary based on the layer desired to be transferred. Also, a layer (see layer 6 in FIGS. 3B and 3C) may be deposited on the resulting surface of portion 3A, either before or after portion 3A is planarized and/or smoothed, and the layer may be planarized and/or smoothed, as needed. Layer 6 may be formed of the same materials as layer 4 and promotes subsequent bonding of portion 3A. It is noted that layer 6 may also be used in a structure without layer 4, such as the structure of FIG. 3A. Layers such as 4 and 6 may be included as need in the structure.

Figure 4A:
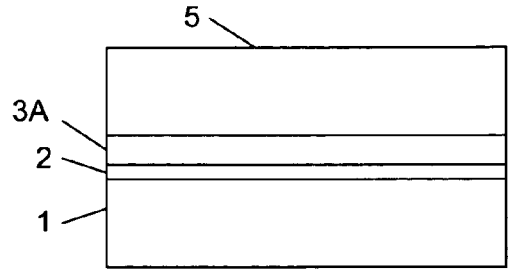
FIGS. 4A, 4B and 4C illustrate bonding of the thinned second substrate to a host wafer with no bonding layer and with a bonding layer, respectively.
Figure 4B:
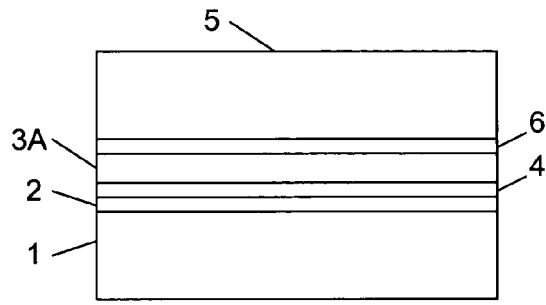
Figure 4C:
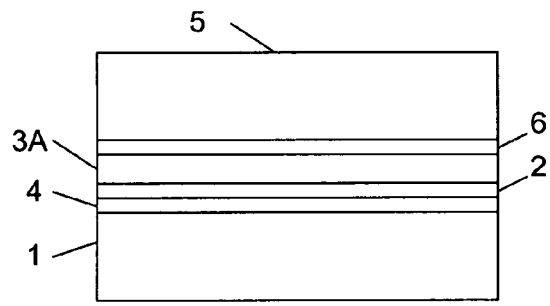
Figure 6A:
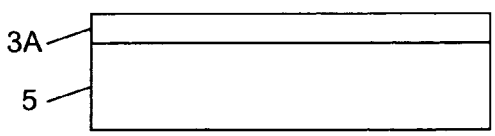
FIGS. 6A and 6B illustrates the structure after separation.
Figure 6B:
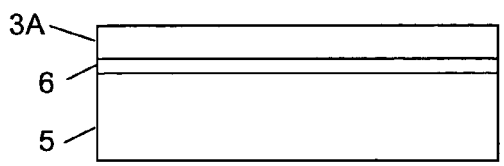
Figure 5A:
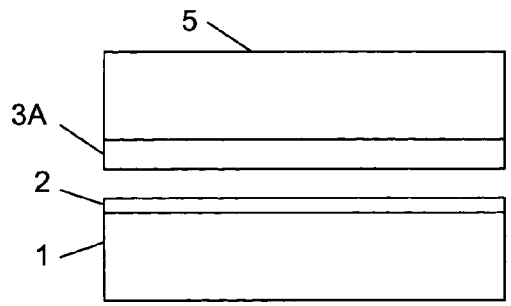
FIGS. 5A-5F illustrate separating the first substrate from the bonded structure, without and with a bonding layer, respectively.
Figure 5B:
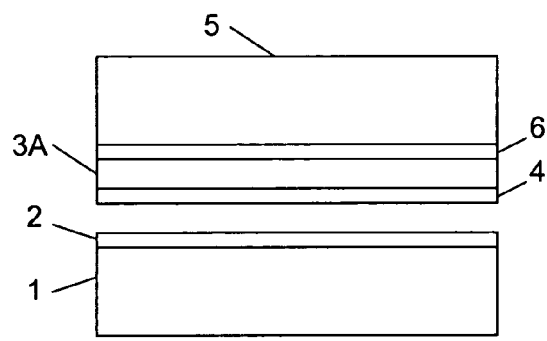
Figure 5C:
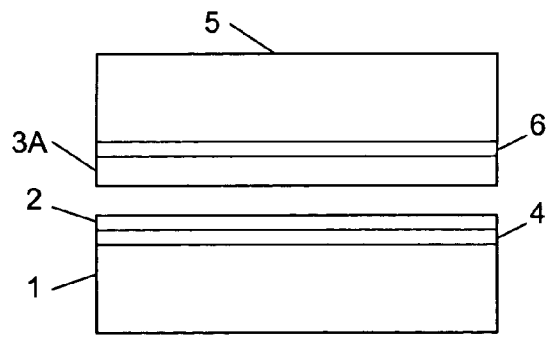
Figure 5D:
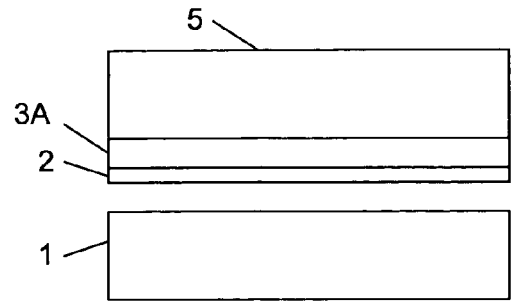
Figure 5E:
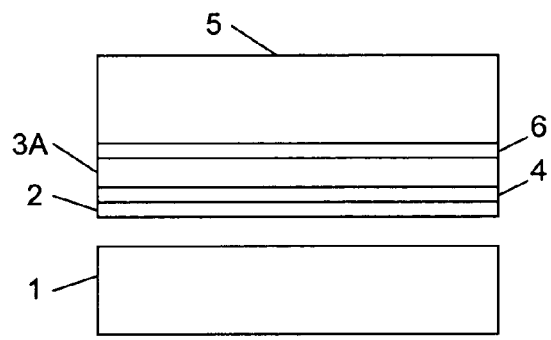
Figure 5F:
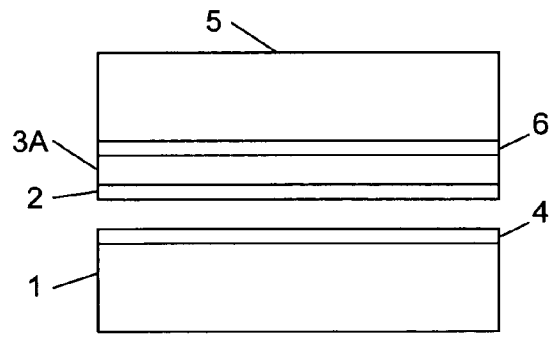

The surface of portion 3A, or the layer 6 formed on the surface of portion 3A, is directly bonded to element 5, which may be made of any solid material, such as silicon, quartz, glass, ceramic, et al., that can provide support for portion 3A, layer 2 and substrate 1 and handling capability for subsequent processing steps described below, and is preferably a host or carrier substrate or wafer (hereinafter referred to as substrate 5 for ease of explanation), at temperatures below the critical temperature at which hydrogen releases from the a-Si:H layer, as shown in FIGS. 4A-4C. The surface of substrate 5 bonded to portion 3A may also be covered with a bonding layer, preferably an oxide and more preferably a deposited silicon oxide, such as a PECVD (Plasma Enhanced CVD) silicon oxide, and may be planarized and/or smoothed, as needed, prior to bonding. Subsequently, the bonded structure is subjected to thermal treatment at a temperature above that at which the impurity, H in the case of a-Si:H, releases. The impurity accumulates to create pressure sufficient to split the substrates, preferably at the interface of layer 2 and portion 3A, as shown in FIGS. 5A-5C. Splitting at this interface minimizes the need to remove any residual portion of layer 2 remaining on portion 3A. It is also possible to split the substrates at the interface between substrate 1 and layer 2, if desired (see FIGS. 5D-5F). FIGS. 6A and 6B illustrate the substrates after splitting and removal (if needed) of layer 2. Layer 2 may be removed by chemical or mechanical techniques, such as touch polishing, dry etching or wet etching, or a combination of such techniques.

A combination of thermal treatment and mechanical peeling of the bonded structure containing substrates 1 and 3 and the substrate 5 can also be used to separate the portion 3A from the substrate 1. For example, after a thermal treatment that is not sufficient to split the substrate 1 from the bonding interface, a thin wedge could be used to insert into the bonding interface to separate them. A gas or water jet that is aligned to the bonding interface can also be used for this purpose.

Figure 7A:
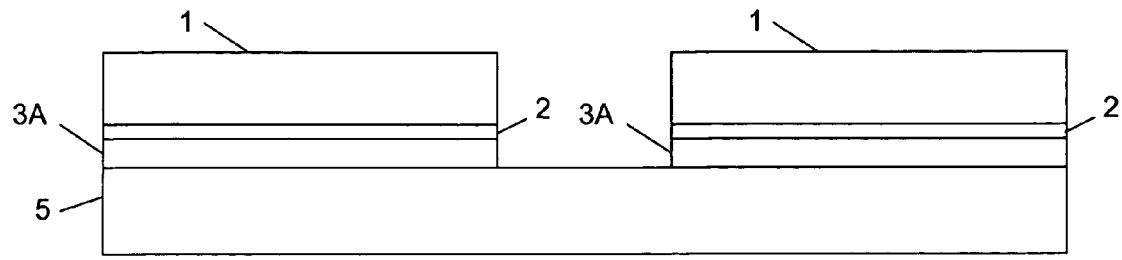
FIGS. 7A and 7B illustrate bonding a plurality of bonded structures to a substrate
Figure 7B:
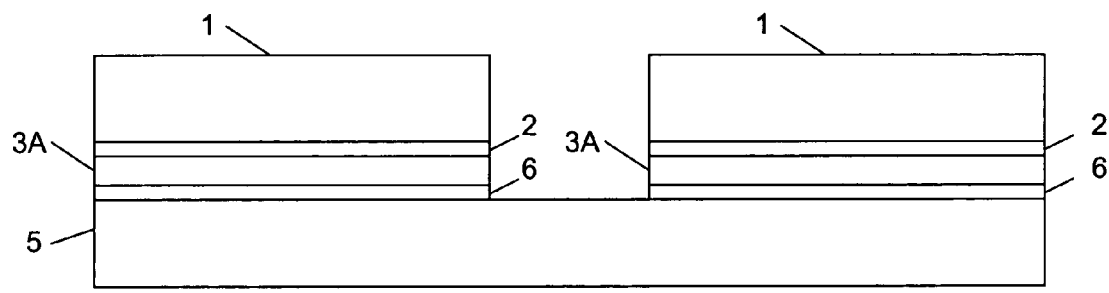
Figure 8A:
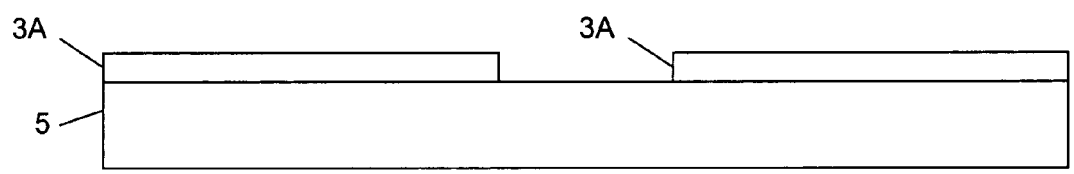
FIGS. 8A and 8B illustrate the plurality of bonded structures after separation.
Figure 8B:
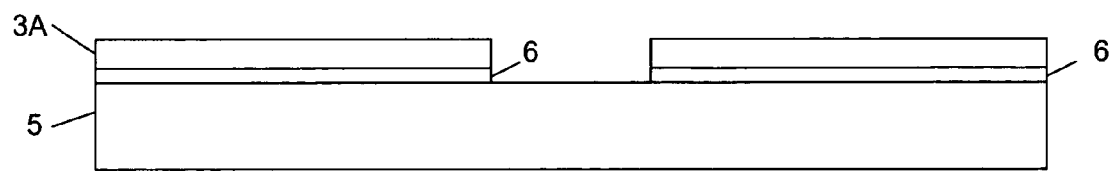

These separation techniques apply also in the case of die-to-wafer bonding. In this case the thinned bonded wafer of substrate 1 and 3A is diced up into dies after planarizing and smoothening the surface of thinned substrate 3A. The dies are then aligned as needed and bonded to the host wafer, substrate 5. After thermal treatment, the handle substrate of all the dies is split off and device layers from all bonded dies have been transferred onto the host wafer. This is illustrated in FIGS. 7A and 7B showing bonded pairs of substrate 1 and portion 3A, after dicing, bonded to substrate 5 without and with a bonding layer 6, respectively. Only two bonded pairs are shown, but the invention is applicable to any number of pairs. FIGS. 8A and 8B show the transferred portions 3A after splitting off of substrates 1. Any remaining portion of layer 2 on surface of layer 3A may be removed by chemical or mechanical techniques, such as touch polishing, dry etching or wet etching, or a combination of such techniques. Also, the bonded pairs may be of different materials, may contain different devices, or both. The invention allows for combining any type of devices and/or layers of materials on a substrate. Layers such as layers 4 and 6 may be incorporated, as needed, into the die to wafer structure.

The thermal treatment may enhance the bond strength of the bond between portions 3A and substrate 5 but at the same time it introduces sufficient amount of hydrogen at the interface between substrates 1 and layer 2 to build up a sufficient internal pressure to split the wafer or dies from the handle wafer or substrate 1.

After detaching, the surface of substrate 3A may contain a-Si:H residues. These residues may be removed with a brief, low pressure polish that may also further result in a smooth surface of substrate 3. A brief dry etch using, for example, an $SF_6$-based etch, can also be used to remove a-Si:H residues.

As discussed above, a-Si:H is preferably used for the amorphous silicon layer. To enhance the adhesion between deposited a-Si:H layer and the surface of the portion 3A or substrate 1, many approaches known in the art can be employed. For example, sputtering of the carrier substrate surface prior to a-Si:H layer deposition may be used to significantly increase the adhesion. In general, the removal of native oxide from surfaces, such as silicon, by chemical etching or an Ar or other gas plasma sputtering before a-Si:H layer deposition will enhance adhesion. The surface treatment can also introduce nucleation sites (discussed in more detail below) on the surface and enhance hydrogen trapping. Also, a thin film may be deposited on substrate 1 as an adhesion promoter, such as a silicon nitride or Ti layer.

Hydrogen in a-Si:H layer exists mostly as $Si-H_n$ where n=1, 2 and 3. The wafer or die temperature during a-Si:H layer deposition must be kept below the critical temperature at which hydrogen releases from $Si-H_n$ in a-Si:H layer. The release of hydrogen has been demonstrated to start at about 367° C. from Si—H$_2$ and at about 447° C. from Si—H in vacuum, although it has been reported that, since in bulk a-Si:H layer the Si—H bonds are clustered, hydrogen can release at temperatures above about 200° C. Therefore, the preferable temperatures for intrinsic a-Si:H layer deposition is below about 200-447° C.

Separation can be achieved with heat treatment of the bonded structure containing substrates 1 and 3 (or attached dies thereof) and the substrate 5 at a temperature above that at which hydrogen in the a-Si:H layer is evolved. This temperature is preferably below a range of 500° C. to 700° C. where the mobility of molecular hydrogen in silicon is enhanced leading to a decrease in evolved hydrogen concentration and corresponding decreased splitting effectiveness.

In the present invention, the released hydrogen accumulates in the bonded structure. The hydrogen can accumulate at locations that are structurally or energetically favorable to attract hydrogen molecules, i.e., hydrogen nucleation sites. More particularly, the released hydrogen may accumulate at the interface between the a-Si:H layer and the substrate 1 or portion 3A since there are many sites where hydrogen can nucleate, such as interface defects with which the released hydrogen can react. These reactions may result in the formation of a planar grouping of H complexes in close proximity, or platelets at the interface. These platelets may also form during a-Si:H layer deposition. These platelets act as regions for hydrogen atoms to form hydrogen molecules and subsequently during the heat treatment, to form hydrogen bubbles.

As the hydrogen pressure in the bubbles increases, the bubbles grow laterally to finally separate the carrier wafer 1 from the bonded pair when the bond between portion 3A and host wafer 4 is sufficiently strong. The lateral bubble growth is energetically favorable to deformation of the thin host wafer 4. When the structure containing substrates 1, portion 3A and amorphous silicon layer 2 is bonded to the substrate 5, in which both substrates 1 and 5 are sufficiently thick, such as of half of standard thickness, splitting rather than blistering takes place when hydrogen gas pressure at the interface between the amorphous silicon layer 2 and the substrate 3 or 1 is sufficiently high. That is because the energy required for blistering is much higher that splitting along the already weakened bonding interface between amorphous silicon layer 2 and portion 3A or substrate 1.

The bond energy between substrate 3 or portion 3A and the substrate 5 must be sufficiently strong, for example stronger than approximately 500 mJ/m$^2$, to avoid debonding between substrate 3 or portion 3A and the substrate 5 during subsequent heat treatment separates the carrier wafer. The room temperature bonding according to the invention provides adequate bond strength for this purpose. According to the present invention, the bonding energy obtained at room temperature between the a-Si:H and the surface of substrate 3/portion 3A (or oxide-covered substrate or portion) is sufficiently high, e.g. at least approximately 1000 mJ/m$^2$. This bond energy is further sufficiently high to permit processes such as CMP, grinding, polishing, etching and dicing. The porous nature of the a-Si:H layer and the oxide layer (when present) that can absorb by-products of the reaction at the bonding interface contributes to the high bond strength, to enhance the bond.

In order to efficiently detach a-Si:H from substrate 1, the hydrogen concentration in the a-Si:H layer should be higher than a minimum hydrogen concentration needed for detachment. The minimum hydrogen concentration in a-Si:H layer needed for detachment is dependent on the adhesion energy of a-Si:H layer to the substrate. A 10 at % concentration is sufficient for a typical a-Si:H layer. Lower concentrations are possible with a reduced a-Si:H adhesion energy, with the minimum at % hydrogen concentration determined by minimum acceptable a-Si:H adhesion energy given by the application. Higher at % hydrogen concentrations result in splitting at lower temperatures. A 15 at % a-Si:H hydrogen concentration can be split at approximately 400-450° C. The concentration of hydrogen may range from 5-20 at %, with a preferred range of 10-15 at %.

By introducing sufficiently high concentration hydrogen-trapping centers that can act as nucleation sites for subsequent hydrogen platelet formation and splitting at a desired location, the splitting plane can be preferably determined. For example, the splitting plane can be the bonding interface between amorphous silicon layer 2 and portion 3A so that after splitting, almost no amorphous silicon residue needs to be removed as described previously. This is achieved with a sufficiently high concentration of hydrogen-trapping centers induced on the surface of amorphous layer 2 and/or on the surface of thinned substrate 3A before bonding. The location of the splitting plane can be further determined by the relative adhesion energy between the amorphous silicon layer 2 and substrate 1 and the bond energy between amorphous layer and portion 3A. For example, if the adhesion energy between the amorphous silicon layer 2 and substrate 1 is larger than the bonding energy between amorphous layer and portion 3A the amorphous layer will preferably detach between portion 3A and amorphous layer. A lower bond energy between amorphous layer and portion 3A may be induced with a slight roughening of the surfaces being bonded before bonding, i.e., either of both of amorphous layer surface, substrate 3 or substrate 3 covered with layer 4. Sputtering or exposure to plasma may be used to roughen the surface(s). Exposure to an aqueous solution that slightly etches the surface may also be used to result in a desired increase in roughness. This roughened surface may also result in an increase in nucleation sites at this location to facilitate splitting at a desired location.

Hydrogen nucleation sites can be created on the surface of a substrate according to the present invention by different techniques. Mechanical roughening of the surface is one technique. For instance, using Ar RIE sputtering with a power of 200 W at 17 mTorr can generate an oxide surface roughness at around 5 to 10 Å compared with 2 Å after CMP. Introducing a layer of hydrocarbon on the surface is another technique. Annealing wafers that are put in a plastic box at ~100° C. for 10 m can introduce a hydrocarbon layer on the wafer surfaces In a variation of the first embodiment of the present invention, boron is added to the a-Si:H layer, preferably during deposition. Alternatively, ion implantation can be used to introduce boron into amorphous silicon layer. Doping with boron or another group III element can significantly lower the splitting temperature (besides boron, aluminum (Al), gallium (Ga) and Indium (In) have similar effects in lowering hydrogen release temperature). A small boron concentration such as $1 \times 10^{16}$ cm$^{-3}$ to $1 \times 10^{20}$ cm$^{-3}$ can lower the splitting temperature by almost 200° C. compared with intrinsic a-Si:H layers. The splitting temperature can be lowered to about 160° C. For example, an a-Si:H layer with ~15 at. % hydrogen concentration and about $1 \times 10^{20}$ cm$^{-3}$ boron concentration, splitting takes place at approximately 300° C. (furnace annealing). If a hot plate is used for the thermal treatment, the splitting temperature can be lowered by more than 50° C. compared with that of furnace annealing. With increasing hydrogen concentration, as noted before, the splitting temperature can be lowered further. Therefore, the preferable temperatures for B-doped a-Si:H layer deposition is below about 150° C.

The surface smoothness of the surfaces to be bonded should be sufficient for the bonding steps. If the as-deposited surface roughness is not smooth enough for bonding (less than 1 nm and preferably less than 0.5 nm), polishing and/or etching may be performed to planarize and smooth the surface of the amorphous silicon layer in preparation for bonding. The surface preparation may be performed as described in application Ser. No. 09/505,283. Briefly, the surface of the amorphous silicon is polished to have a surface roughness less than 1 nm and preferably less than 0.5 nm and a planarity preferably less than 20 Å over a 10 µm range. After polishing the surface is cleaned and dried to remove any residue from the polishing step. The polished surface is preferably then rinsed with a solution.

The surfaces are then preferably activated to enhance the bonding. The activation process can include a very slight wet or dry chemical (i.e. plasma) etch. The activation process can include forming from a wet solution surface species on the prepared surfaces including for example at least one of a silanol group, an $NH_2$ group, a fluorine group, and an HF group. The activation process can include exposing the prepared surfaces to one of an oxygen, argon, $NH_3$ and $CF_4$ plasma process. The plasma process can be conducted in one of a reactive ion etch (RIE) mode, inductively coupled plasma mode, and a sputtering mode. Regardless, the bonding groups formed on the surface are capable of forming chemical bonds at approximately room temperature. With appropriate bonding and activation, chemical bonds can be formed with a bond strength of at least 500 $mJ/m^2$, preferably at least 1000 $mJ/m^2$, and more preferably at least 2000 $mJ/m^2$. The activation process is a semiconductor compatible process than can be either all wet, all dry, or a combination of wet and dry processes.

FIRST EXAMPLE

An example of the first embodiment will now be described. An intrinsic amorphous silicon (a-Si:H) layer with a thickness of about 0.7 µm and ~16 at. % hydrogen concentration was deposited by PECVD at 190° C. on a silicon handle wafer. To enhance the adhesion between the a-Si:H and the silicon wafer, a thin silicon nitride layer (100-1000 Å) was deposited on the silicon handle wafer surface prior to a-Si:H deposition. Removal of native oxide from the silicon surface by Ar or other gas plasma sputtering before a-Si:H layer deposition will also work. The root mean square (RMS) micro-roughness of the surfaces of the as-deposited a-Si:H layer was around 15 Å, and was smoothed by performing CMP on the deposited a-Si:H layer with a soft pad to produce an RMS surface roughness of ~1 Å. After cleaning and activation by the processes described above, the a-Si:H layer covered Si wafers were direct-bonded at about room temperature to a silicon device wafer having a planarized PECVD oxide layer formed on the surface with a surface roughness of a RMS<5 Å. The silicon device wafer was ground to 25 µm in thickness followed by CMP to further reduce the thickness to 15 µm with a smooth surface of about 2 Å RMS. The thinned silicon wafer was directly bonded to a PECVD oxide covered silicon host wafer, while any solid material with a smooth surface will also work, preferably with a surface roughness RMS<5 Å.

The bonded structure was annealed at 450-500° C. for ~1 hr in a furnace, serving to split the bonded pair at the interface between a-Si:H layer and the silicon handle wafer. If a stand-alone a-Si:H deposited silicon wafer is used, bubbles start to generate at temperature ~250° C. with a low density of about 16/$cm^2$ due to the release of hydrogen from the hydrogen trapping centers and molecular hydrogen forms platelets at the a-Si:H layer deposition interface. The bubble density and size increase with temperature. If heated from one side as by platen heating on, for example, a hot plate, the splitting temperature was ~350° C. Any residual a-Si:H that was transferred from the silicon wafer was removed by polishing or wet or dry chemical etching. By this illustrative process, the thin device layer on the silicon device wafer has been transferred onto a desired host wafer.

Figure 9:
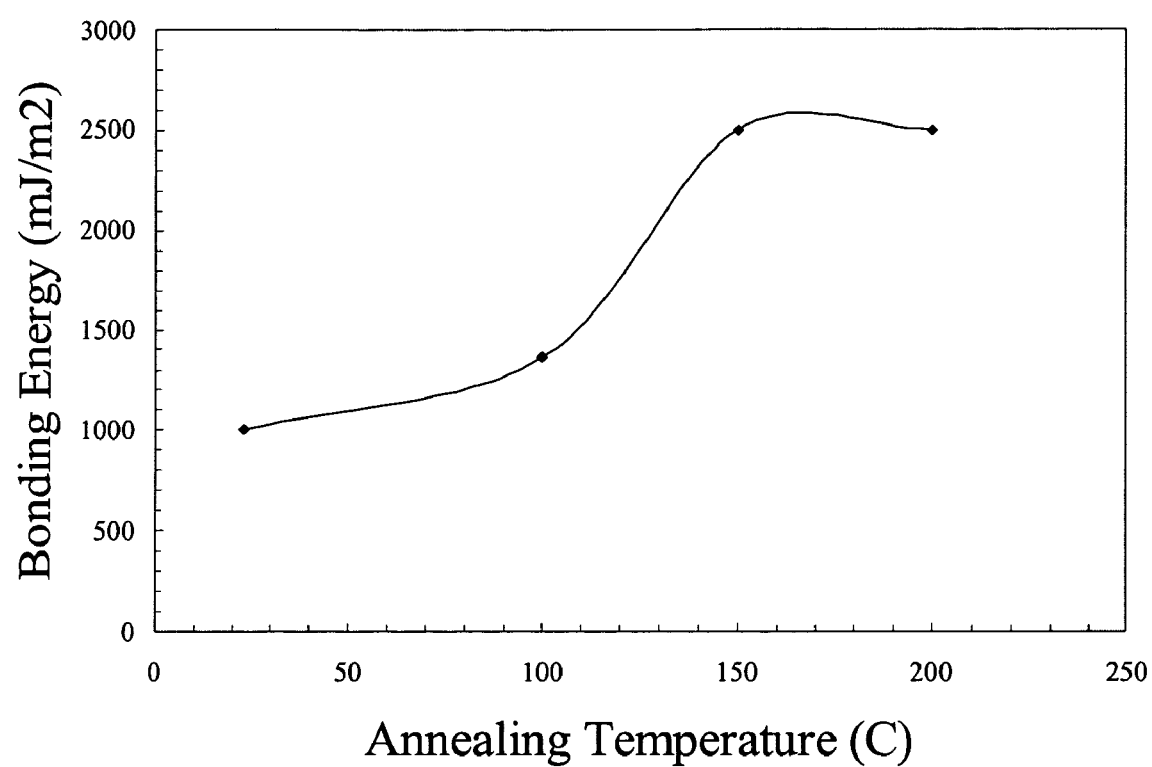
FIG. 9 is graph depicting the bonding energy of a bonded pair of an amorphous silicon layer covered silicon wafer and PECVD oxide covered silicon wafer as a function of annealing temperature.

The bonding energy of the amorphous hydrogenated silicon layer to the substrate 1 as a function of temperature is shown in FIG. 9. With increasing temperature, the bonding energy of a-Si:H layer bonded pairs will first increase and then decrease until separated. The room temperature bonded pairs have an adequate bonding strength for process steps such as CMP, grinding, etching and dicing. As mentioned above, such a high bond strength is attributed in part to the porous nature of the a-Si:H layer and the oxide layer (when present) that can absorb by-products of the reaction at the bonding interface to enhance the bond.

SECOND EXAMPLE

In a second example, a PECVD a-Si:H layer was deposited on a 300 Å SiN covered silicon handle wafer at 150° C. and doped with boron. The a-Si:H layer is 0.7 µm thick, contains ~20 at. % hydrogen, and is in situ doped with boron to a concentration of $1 \times 10^{20}$ $cm^{-3}$. Other doping methods may be used. Due to the release of hydrogen from the silicon hydrogen complexes, surface bubbles start to generate at temperature of ~160° C. with low density about 20/$cm^2$. It is known that even at room temperature B (and other group III elements) can be strongly passivated by H resulting in formation of B—H complexes. The B—H complexes dissociate at temperatures as low as 160° C. in silicon. Moreover, the Si—H bond appears to be weakened by the presence of B next to it. Planarized PECVD oxide covered Si device wafers that are fully processed and were tested were used as a matching wafer (i.e., wafer 3 in FIG. 2). The bonding energy of the room temperature bonded pair of handle wafer 1/amorphous silicon layer 2/wafer 3 is ~1000 $mJ/m^2$. The bonding energy does not increase remarkably with temperature and starts to fall at above ~160° C.

The room temperature bonded pairs can withstand all process steps such as CMP, grinding, etching and dicing. In this case identical processing conditions are used to transfer the device layer onto a new desired host wafer (i.e., substrate 5 in FIGS. 4A and 4B) except that the splitting temperature has been dropped to ~300° C. (upon furnace annealing) or ~250° C. (upon hot plate annealing). Increasing boron doping concentration in a-Si:H layer can further lower the splitting temperature. For example, the a-Si:H layer contains ~20 at. % hydrogen, and is in situ doped with boron to a concentration of $5 \times 10^{20}$ $cm^{-3}$, the splitting temperature was lowered to 220° C. (upon furnace annealing). In the performance of the process according to the invention, other layers such as amorphous silicon containing deuterium, helium, neon, krypton and xenon may also be used and will have splitting temperatures according to their respective impurity desorption temperatures. If a higher temperature splitting is required, deuterium rather than hydrogen can be used in the amorphous silicon layer because of the higher deuterium release temperature. Debonding of a-Si:H layer at low temperatures according to the invention makes layer transfer of materials that are dissimilar to the host wafers feasible.

Thus, in the present invention, a layer or a device layer on a substrate may be transferred onto another host substrate with the layer or device "top up." This is a useful process for three-dimensional integrated circuits preparation in which several thin device layers are stacked and interconnected. As such, in the case of a silicon device wafer, performance and integrity are preserved and enhanced due to the transfer to the new host substrate for example whose electrical (i.e., dielectric) properties and thermal conductivity properties can be better than the original silicon device wafer itself, i.e. the dielectric constant can be lower and the thermal conductivity higher.

A second embodiment that utilizes an amorphous layer other than silicon, for example silicon oxide is also possible. In this embodiment, a silicon oxide layer is formed under conditions that results in a very high hydrogen concentration in the silicon oxide layer. An example is a silicon oxide layer deposited by Plasma Enhanced Chemical Vapor Deposition (PECVD) at low temperatures, for example 100-200° C., and preferably 100-150° C. This silicon oxide deposition may use a mixture of silane and oxygen and may be balanced with hydrogen, argon, helium, or nitrogen. The silane and oxygen mixture may further be at higher silane concentrations relative to typical deposition conditions used for silicon oxide deposition, for example 20% to 50% silane. This example of silicon oxide deposition may result in a hydrogen concentration in the range of 5% to 20%. Subsequent heating of low temperature PECVD silicon oxide layer in excess of the deposition temperature, for example, 200-400° C., results in release of hydrogen from the silicon oxide layer. The use of the low temperature PECVD silicon oxide layer as layer 2 described in FIGS. 1-8 can thus result in splitting at temperatures at or below 400° C. The low temperature PECVD silicon oxide layer can be formed on a lower hydrogen concentration silicon oxide layer, for example a PECVD silicon oxide layer deposited in excess of 350° C., to result in a two-layered structure similar to that described in the First Embodiment with regard to layers 2 and 4. Alternatively, the low temperature PECVD silicon oxide layer may be formed on top of a material with a low hydrogen diffusivity, the material with a low hydrogen diffusivity may be formed on top of the low temperature PECVD silicon oxide layer, or the material with a low hydrogen diffusivity may be formed on top of and underneath the low temperature PECVD silicon oxide layer. A thin layer of the material is preferable, for example 100-1000 angstroms. The minimal thickness of the layer of material is proportional to the hydrogen diffusivity of the material. The material enhances heating-induced splitting by inhibiting the diffusion of hydrogen away from the low temperature PECVD silicon oxide layer. Examples of a low hydrogen diffusivity material include metals like titanium, aluminum, and nickel or amorphous silicon. A combination of layer is also possible. Furthermore, a higher adhesion energy of bonding layer 4 on substrate 3 than bonding energy of splitting layer 2 on substrate 3 or portion 3A or higher concentration of hydrogen nucleation sites at interface between splitting layer 2 and substrate 3 or portion 3A will result in minimum residue of splitting layer 2 on portion 3A after splitting as described in the First Embodiment.

The present invention is fully compatible with normal semiconductor industry processing techniques. Also, a substrate after being separated from the bonded pair can be re-used. Appropriate cleaning, etching and/or surface treatment of the substrate 1 may be needed.

Numerous modifications and variations of the present invention are possible in light of the above teachings. It is therefore to be understood that within the scope of the appended claims, the invention may be practiced otherwise than as specifically described herein.

The claim inventioned is:

1. A method of forming a structure, comprising:
   forming a structure comprising a first element, an amorphous silicon layer disposed on said first element, a second element disposed on said layer ; and
   heating said structure at a temperature to detach said first element from said structure at a location ranging from approximately an interface between said first element and said layer to approximately an interface between said second element and said layer.

2. A method as recited in claim 1, comprising:
   detaching said first element from said structure at approximately said interface between said amorphous silicon layer and said first element.

3. A method as recited in claim 1, comprising:
   bonding said second element to said amorphous silicon layer; and
   removing a substantial portion of said second element after bonding said second element to said amorphous silicon layer.

4. A method as recited in claim 3, wherein removing comprises at least one of grinding and polishing.

5. A method as recited in claim 1, wherein said second element comprises a substrate having a device layer, said method comprising:
   removing a substantial portion of said substrate to leave said device layer.

6. A method as recited in claim 5, comprising:
   bonding a third element to said second element after said removing.

7. A method as recited in claim 1, wherein forming said amorphous silicon layer comprises forming a hydrogenated amorphous silicon layer.

8. A method as recited in claim 7, comprising:
   forming a hydrogenated amorphous silicon layer having at least about 5-20 at. % hydrogen concentration.

9. A method as recited in claim 7, comprising:
   forming a hydrogenated amorphous silicon layer having at least about 10-15 at. % hydrogen concentration.

10. A method as recited in claim 7, comprising:
    forming an adhesion-promoting layer on one of said first and second elements;
    forming said hydrogenated amorphous silicon layer on said adhesion promoting layer; and
    detaching said first element from said structure at a location ranging from approximately an interface between one of said first and second elements and said amorphous silicon layer to approximately an interface between said adhesion promoting layer and said amorphous silicon layer.

11. A method as recited in claim 10, comprising: forming one of a Ti and a silicon nitride layer as said adhesion-promoting layer.

12. A method as recited in claim 7, comprising: adding B to said hydrogenated amorphous silicon layer.

13. A method as recited in claim 12, comprising: adding B to a concentration of about $1\times10^{16}$ cm$^{-3}$ to $1\times10^{21}$ cm$^{-3}$.

14. A method as recited in claim 7, comprising: adding one of B, In, Ga and Al to said hydrogenated amorphous silicon layer.

15. A method as recited in claim 7, wherein forming said hydrogenated amorphous silicon layer comprises:
    depositing said hydrogenated amorphous silicon layer below a temperature at which hydrogen releases from said amorphous silicon layer.

16. A method as recited in claim 7, comprising:
forming said amorphous hydrogenated silicon at a temperature between about 20° C and 150° C.
17. A method as recited in claim 1, comprising:
forming an amorphous silicon layer having impurities in a range of approximately 10-15 at. %.
18. A method as recited in claim 17, comprising:
heating said structure at a temperature where said impurities in said amorphous silicon layer are released.
19. A method as recited in claim 18, comprising:
heating said structure at a temperature of at least 200° C.
20. A method as recited in claim 17, comprising:
forming said amorphous silicon layer at a temperature below a temperature where said impurities in said amorphous silicon layer are released.
21. A method as recited in claim 17, comprising:
bonding a third element to said second element; and
heating said structure at said temperature where said impurities in said amorphous silicon layer are released and a bond is strengthened between said second and third elements.
22. A method as recited in claim 17, comprising:
forming an amorphous silicon layer having impurities selected from a group consisting of hydrogen, deuterium, helium, neon, krypton and xenon.
23. A method as recited in claim 1, wherein:
forming said amorphous silicon layer comprises forming a hydrogenated amorphous silicon layer; and
said structure is heated at a temperature where hydrogen releases from said hydrogenated amorphous silicon layer.
24. A method as recited in claim 23, comprising:
using said released hydrogen to detach said first element from said structure.
25. A method as recited in claim 24, comprising:
accumulating hydrogen at approximately said interface between one of said first and second elements and said hydrogenated amorphous silicon layer.
26. A method as recited in claim 24, comprising:
accumulating hydrogen at approximately said interface between said first element and said hydrogenated amorphous silicon layer.
27. A method as recited in claim 24, comprising:
forming hydrogen bubbles in said structure.
28. A method as recited in claim 1, comprising:
forming nucleation sites on one of said first and second elements prior to forming said amorphous silicon layer.
29. A method as recited in claim 28, wherein forming said nucleation sites comprises performing at least one of the following processes on a surface of said first element on which said amorphous silicon film is formed:
roughening said surface;
forming a hydrocarbon on said surface; and
exposing said surface to a plasma.
30. A method as recited in claim 29, wherein exposing comprises:
exposing said surface to one of a N and Ar plasma in reactive ion etch mode.
31. A method as recited in claim 1, comprising:
forming a deposited oxide on said first element; and
forming said amorphous silicon layer on said deposited oxide.
32. A method as recited in claim 1, comprising:
forming an amorphous silicon layer containing at least one of deuterium, helium, neon, krypton and xenon.
33. A method as recited in claim 32, comprising:
heating said amorphous silicon layer containing at least one of deuterium, helium, neon, krypton and xenon at respective temperatures at which deuterium, helium, neon, krypton and xenon desorb from said amorphous silicon layer.
34. A method as recited in claim 1, comprising:
heating said amorphous silicon layer to release a species present in said amorphous silicon layer; and
using said species to detach said first element from said amorphous silicon layer.
35. A method as recited in claim 34, comprising:
accumulating said species at said interface between said first element and said amorphous silicon layer.
36. A method as recited in claim 1, comprising:
planarizing the amorphous silicon layer.
37. A method as recited in claim 36, wherein said planarizing comprises:
at least one of polishing and etching said amorphous silicon layer.
38. A method as recited in claim 1, wherein the bonding comprises:
forming a plurality of said structures;
bonding each of said plurality of structures to third element; and
detaching a first element from each of said structures.
39. A method as recited in claim 1, comprising:
heating at a temperature of at least 200° C.
40. A method as recited in claim 1, comprising:
heating at a temperature in a range of 450-500° C.
41. A method as recited in claim 1, comprising:
adding B to said amorphous silicon layer.
42. A method as recited in claim 41, comprising:
adding B to a concentration of about $1\times10^{16} cm^{-3}$ to $1\times 10^{21} cm^{-3}$.
43. A method as recited in claim 1, comprising:
adding one of B, In, Ga and Al to said amorphous silicon layer.
44. A method as recited in claim 1, wherein heating comprises at least one of furnace heating and platen heating.
45. A method a recited in claim 1, comprising:
detaching said first element at approximately an interface between said second element and said amorphous silicon layer.
46. A method as recited in claim 45, comprising:
removing any residual amorphous silicon material from said second element remaining after said detaching step.
47. A method a recited in claim 1, comprising:
detaching said first element at an interface between said first element and said amorphous silicon layer.
48. A method as recited in claim 47, comprising:
removing any residual amorphous silicon material from said second element remaining after said detaching step.
49. A method as recited in claim 1, comprising:
forming a bonding layer on said first element;
forming said amorphous silicon layer on said second element; and
bonding said amorphous silicon layer to said bonding layer.
50. A method as recited in claim 1, comprising:
forming a bonding layer on one of said second element and a third element;
bonding said second element to said third element using said bonding layer.
51. A method as recited in claim 1, comprising:
reducing a bond energy between said amorphous silicon layer and said first element.

52. A method as recited in claim 51, wherein said reducing step comprises:
increasing a surface roughness of at least one of said amorphous silicon layer and said first element.

53. A method as recited in claim 1, comprising:
forming said structure comprising said first element comprising a first carrier substrate, an amorphous silicon layer disposed on said carrier substrate, and said second element comprising a donor workpiece disposed on said layer;
bonding said second element to a third element comprising a second carrier substrate; and
heating said structure at a temperature to detach said first carrier substrate from said structure.

54. A method as recited in claim 1, comprising:
bonding a third element to said second element prior to said heating.

55. A method as recited in claim 1, comprising:
removing a substantial portion of said second element prior to said heating.

56. A method as recited in claim 1, comprising:
detaching said first element from said structure at approximately said interface between said amorphous silicon layer and said second element.

57. A method as recited in claim 1, comprising:
forming said amorphous silicon having planar groupings of hydrogen complexes 58. A bonding method, comprising:
forming a structure comprising a first element, a silicon oxide layer having about 5-20 at. % hydrogen disposed on said first element, and a second element disposed on said layer;
bonding said second element to a third element to form a structure; and
heating said structure at a temperature to detach said first element from said structure.

59. A method as recited in claim 58, comprising:
forming said silicon oxide layer using plasma enhanced chemical vapor deposition at a temperature in a range of about 100-200° C.

60. A method as recited in claim 58, comprising:
forming said silicon oxide layer using plasma enhanced chemical vapor deposition at a temperature in a range of about 100-150° C.

61. A method as recited in claim 58, comprising:
heating said structure at a temperature above a temperature at which said silicon oxide layer is formed.

62. A method as recited in claim 58, comprising:
forming a low hydrogen diffusivity layer disposed one of between said silicon oxide layer and said first element, between said silicon oxide layer and said second element, and between said silicon oxide layer and both of said first and second elements.

63. A method as recited in claim 62, comprising:
forming said low hydrogen diffusivity layer as one of aluminum, nickel, titanium and amorphous silicon.

64. A method as recited in claim 58, comprising:
heating said structure at a temperature above a temperature at which hydrogen in said silicon oxide layer is released.

65. A method as recited in claim 58, comprising:
reducing a bond energy between said amorphous silicon layer and said first substrate.

66. A method as recited in claim 65, wherein said reducing step comprises:
increasing a surface roughness of at least one of said amorphous silicon layer and said first element.

67. A method as recited in claim 58, comprising:
forming said silicon oxide layer to have a hydrogen concentration of about 10-15 at. %.

68. A method as recited in claim 58, comprising:
forming said silicon oxide using a gas having about 20-50% silane.

69. A method as recited in claim 58, comprising:
forming said structure comprising said first element comprising a first carrier substrate, a silicon oxide layer having about 5-20 at. % hydrogen disposed on said carrier substrate, and said second element comprising a donor workpiece disposed on said layer;
bonding said donor workpiece to said third element comprising a second carrier substrate to form a structure; and
heating said structure at a temperature to detach said first carrier substrate from said structure.

70. A structure, comprising:
a first element;
a substrate portion having a first surface bonded to said first element, directly or through an intervening bonding layer, and a second surface, opposing said first surface, detached from one of an amorphous silicon layer and a silicon oxide layer each containing about 5-20 at. % hydrogen.

71. A device as recited in claim 70, comprising:
said silicon oxide layer containing about 10-15 at. % hydrogen.

72. A device as recited in claim 70, comprising:
said amorphous silicon layer containing a boron concentration of about $1 \times 10^{16}$ cm$^{-3}$ to $1 \times 10^{21}$ cm$^{-3}$.

73. A device as recited in claim 70, wherein:
said first element comprises a first carrier substrate.

74. A method of forming a structure, comprising:
forming a structure comprising a first element, an amorphous silicon-containing layer disposed on said first element, and a second element disposed on said layer;
heating said layer to release a species present in said layer; and
using said species to detach said first element from said layer.

75. A method as recited in claim 74, comprising:
accumulating said species at one of approximately an interface between said first element and said amorphous silicon layer and between said second element and said amorphous silicon layer.

76. A method as recited in claim 74, wherein said layer comprises hydrogenated amorphous silicon.

77. A method as recited in claim 76, comprising adding a group II material to said layer.

78. A method as recited in claim 74, wherein said layer comprises hydrogenated silicon oxide.

* * * * *

(12) INTER PARTES REVIEW CERTIFICATE (6th)
United States Patent                (10) Number:    US 7,462,552 K1
Tong et al.                          (45) Certificate Issued:   Apr. 1, 2014

(54) METHOD OF DETACHABLE DIRECT BONDING AT LOW TEMPERATURES

(75) Inventors: Qin-Yi Tong; Gaius Gillman Fountain Jr.

(73) Assignee: Ziptronix, Inc.

Trial Number:

IPR2013-00239 filed Apr. 5, 2013

Petitioner: Taiwan Semiconductor Manufacturing Company, Limited

Patent Owner: Ziptronix, Inc.

Inter Partes Review Certificate for:

Patent No.: 7,462,552
Issued:     Dec. 9, 2008
Appl. No.:  11/134,359
Filed:      May 23, 2005

The results of IPR2013-00239 are reflected in this inter partes review certificate under 35 U.S.C. 318(b).

INTER PARTES REVIEW CERTIFICATE
U.S. Patent 7,462,552 K1
Trial No. IPR2013-00239
Certificate Issued Apr. 1, 2014

AS A RESULT OF THE INTER PARTES REVIEW PROCEEDING, IT HAS BEEN DETERMINED THAT:

Claims 1, 7-11, 17, 18, 22-24, 27, 31, 34, 45, 46, 54, 56, 74 and 76 are canceled.

\* \* \* \* \*